United States Patent [19]

Canel et al.

[11] 4,437,173

[45] Mar. 13, 1984

[54] CORE MEMORY CONTROLLED BY AUXILIARY CORE

[75] Inventors: Jules E. Canel, Granada Hills; Thomas J. Gilligan, Rolling Hills Estates, both of Calif.

[73] Assignee: Ampex Corporation, Redwood City, Calif.

[21] Appl. No.: 284,133

[22] Filed: Jul. 16, 1981

[51] Int. Cl.³ .............................................. G11C 7/02
[52] U.S. Cl. .................................. 365/193; 365/130; 365/209
[58] Field of Search ............... 365/130, 189, 193, 206, 365/209

[56] References Cited

U.S. PATENT DOCUMENTS 3,054,988 9/1962 Edwards et al. .................... 365/189
3,641,519 2/1972 Ashley ................................ 365/193

Primary Examiner—James W. Moffitt

Attorney, Agent, or Firm—Fraser and Bogucki

[57] ABSTRACT

A core memory utilizes an auxiliary core that is driven concurrently with selected data cores to increase tolerances by automatically tracking the peaking time and the output magnitude. Wide variations in both the magnitude and duration of core output switching signals are compensated by use of the auxiliary core to control the sensing strobe time during a read part cycle and drive current duration during both read and write part cycles. Subtracting half of the auxiliary core output switching signal from a selected data core output switching signal normalizes the difference about zero volts with a one being indicated by the presence of a positive voltage and a zero by a negative voltage. With the reference threshold at zero there is no precise adjustment. Since the peak of the auxiliary core output tracks the peak of the selected data core output, substantial changes in the peaking and switching times do not interfere with accurate determinations of data core data states.

18 Claims, 13 Drawing Figures

CORE MEMORY CONTROLLED BY AUXILIARY CORE

CROSS REFERENCE TO RELATED APPLICATIONS

This application is related to the following applications:

"Selectively Complementing Data Store And Method of Operation," Ser. No. 283,970, filed July 16, 1981, by Jules Eugene Canel and Theodore Alton Conant.

"Low Noise Core Memory Sense Winding," Ser. No. 284,092, filed July 16, 1981, by Thomas James Gilligan; and "Core Memory With Return Current Drive Scheme," Ser. No. 283,973, filed July 16, 1981, by Thomas James Gilligan.

BACKGROUND OF THE INVENTION

1. Field of the Invention

This invention relates to core memories and more particularly to small core memories utilizing feedback from an auxiliary timing core to economically optimize sensing and drive times without complicated close toleranced drive circuits.

2. Discussion of the Prior Art

Magnetic core memories utilize arrays of square hysteresis loop memory cores which are selectively switched from one state of magnetization to another to store a given data condition. Data readout is accomplished by switching a selected core toward a given state. If the core switches and therefore produces a substantial output switching voltage signal it is determined to have stored a "one". If the core was already in the given state and therefore does not switch it is determined to have stored a "zero".

Sensing is complicated by changes in the switching signal with ambient conditions and by noise signals which accompany the switching signal. The noise signals, which are caused by the coupling of drive currents into the sense windings and from unbalanced delta noise induced in unselected cores receiving a partial select drive current, tend to occur early with respect to a core output switching signal. The magnitude tends to decrease rapidly toward zero as the read part cycle progresses. The noise can thus be distinguished from the switching signal by generating a strobe signal to command the sensing of the output switching signal at a time subsequent to the noise signal peak but soon enough that the switching signal magnitude is still substantial. Sensing occurs relative to a voltage threshold which must be sufficiently high to distinguish over any noise remaining on the sense windings at the time of the strobe signals yet sufficiently low that a valid output switching signal will remain above the threshold for sufficient time following the strobe signal to permit detection.

Changes in drive current magnitude greatly affect the nature of the noise signals and core switching signals. High drive currents tend to produce fast peaking, large magnitude signals with fast switching times while low drive currents tend to produce slow peaking, low magnitude signals with long switching times. Temperature changes tend to have similar effects with the exact relationship dependent upon the composition of the particular type of core that is used.

It is thus seen that for high drive conditions, the strobe time should occur early relative to the drive current rise time and the threshold should be relatively high to distinguish the relatively large noise signal that will remain at the early time even with a large drive current. However, with an early strobe and high voltage threshold, a low drive current or corresponding temperature condition may preclude proper separation of the core switching signal from the noise. The delayed timing and small magnitude of the switching peak may cause the switching signal to fail to exceed the reference voltage at the time of the strobe, thus causing a "one" to be sensed as a "zero". Alternatively, the noise may be of sufficient duration and magnitude to be sensed as a "one" irrespective of the actual data state of a selected core.

To assure proper sensing, core memories have traditionally employed high quality current drivers with tolerances on the order of plus or minus 10-15%. Frequently the drive currents are varied in response to sensed core temperature conditions to compensate for the corresponding changes in core switching characteristics. Drive current duration times must be established sufficiently long to accommodate worst case (low drive) conditions. Under high drive conditions the drive current duration is thus longer than necessary, thus wasting power and subjecting partially selected cores to disturb currents for longer than necessary.

SUMMARY OF THE INVENTION

A core memory in accordance with the invention which is highly tolerant of changes in drive current magnitude and temperature includes a data storage stack including an array of data storage cores and a timing core coupled to receive substantially the same magnitude of drive current as a selected data storage core; a timing core sensing circuit coupled to sense the switching signal voltage output of the timing core and generate a feedback switching signal corresponding thereto as the timing core is switched by the drive current; current drive circuitry coupled to drive a selected data storage core and the timing core with currents of sufficient magnitude to switch the cores from one state of magnetization to another in response to current command signals; and a timing and control circuit responsive to address and data commands and to the feedback switching signal for generating the current command signals required to switch selected data storage cores. Further, in accordance with the invention, one-half the output signal of the timing core is subtracted from the output switching signal of a selected data core. The difference is compared to zero to determine the output data state at a particular temporal point in the feedback switching signal such as the voltage peak.

Instead of closely controlling the drive currents to fixedly match switching signal characteristics to a fixed reference voltage threshold and strobe time as the memory ages and encounters temperature changes, the switching signal is allowed to vary within wide limits while an inexpensive sensing circuit adaptive by responds to actual signal conditions to optimize the strobe time, threshold reference voltage level and drive current duration.

Subtraction of half of the feedback switching signal from the selected data core output switching signal in effect adjusts the reference threshold in accordance with actual, instantaneous core switching characteristics while facilitating simple hardware which compares the data core output switching signal against a fixed reference of zero volts. Peak detection of the feedback signal optimizes the strobe time for dynamically varying actual conditions while controlling drive current duration in response to actual switching signal characteristics avoids the consumption of unnecessary power.

BRIEF DESCRIPTION OF THE DRAWINGS

A better understanding of the invention may be had from a consideration of the following detailed description taken in conjunction with the accompanying drawings in which.

DETAILED DESCRIPTION

Figure 1:
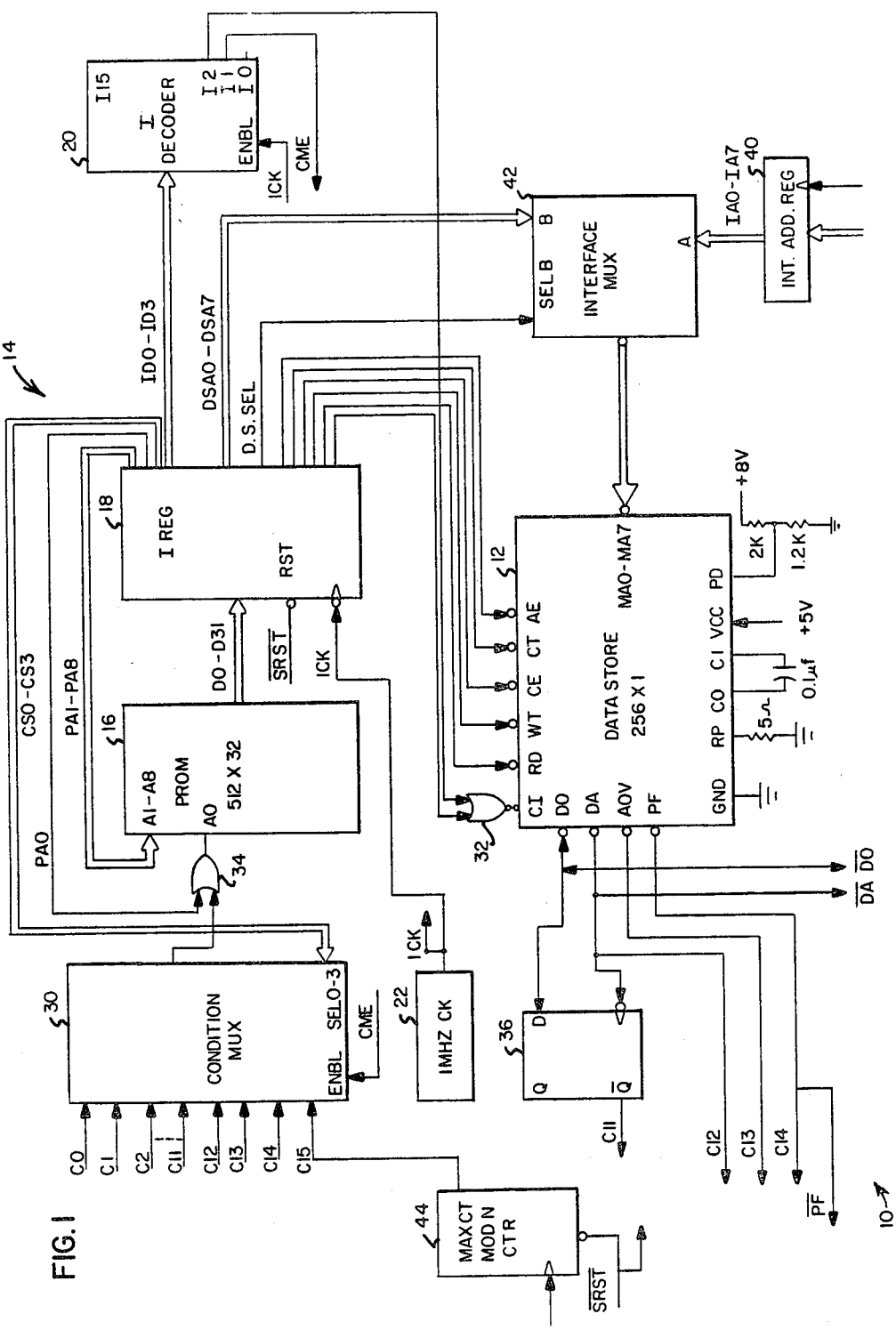
FIG. 1 is a schematic and block diagram illustrating a data processing system having a state sequencing device and a data store utilizing magnetic feedback timing in accordance with the invention.

As shown in FIG. 1, a specific example of a data processing system with selectively complementing data store 10 includes a selectively complementing data store 12 coupled to a state sequencer 14 including a 512 word by 32 bit data store in the form of a PROM 16, an instruction register 18 coupled to receive and store data output from PROM 16, and an instruction decoder 20 coupled to receive and decode four of the 32 bits received and stored by instruction register 18. A one megahertz symmetrical clock generator 22 is coupled to load the instruction register 18 on a negative going edge thereof and to enable instruction decoder 20 500 nanoseconds later for 500 nanoseconds while in a high or logic 1 condition. A system reset signal, $\overline{SRST}$, which may be externally generated, initializes the state sequencer 14 by resetting instruction register 18 to 0. This causes a predetermined zero address to be presented to PROM 16 which produces an output D0–D31 in response thereto. At the next negative transition of the clock signal, 1CK, instruction register 18 loads the 32 bit output from PROM 18 and presents a new address to PROM 18 on lines PA0–PA8. At the same time instruction decoder 20 decodes the four bits ID0–ID3 output by instruction register 18 and during the following high transition of the one megahertz clock signal outputs one of sixteen decoded output signals as a 500 nanosecond pulse.

In the present example only fifteen conditions are actually output with decoder output I0 being utilized as a no operation condition. Furthermore, only two of the coded instructions have been implemented in the present example. Instruction I1 is utilized to enable a condition multiplexer 30 while an instruction I2 is utilized to generate a pulsed cycle initiate input to data store 12 via an OR gate 32 which may also receive an unpulsed or continuous cycle initiate signal directly from instruction register 18. Upon the next high to low transition of the clock signal, the instruction register loads a new set of data and presents a new address to PROM 16.

An OR gate 34 enables the implementation of conditional branches by outputting the least significant address bit A0 to PROM 34 while receiving the corresponding address bit from the output of instruction register 18 and a data output signal from condition multiplexer 30. A conditional branch can thus be executed by causing the state sequencer to present to PROM 16 an even numbered address. If the output of condition multiplexer 30 is logic 0, that instruction will be executed. However, if the output of condition multiplexer 30 is at logic 1, OR gate 34 will automatically increment the next address and the following instruction will be executed. For example, if the next address presented to PROM 16 is location 64 and condition MUX 30 presents a logic 1 output, address 65 will actually be presented to PROM 16.

Other peripheral circuits included in the data processing system 10 to facilitate system operation include a data latch 36 which latches output data from data store 12 upon the occurrence of a data available output from store 12. The output of latch 36 is returned through the C11 input to condition multiplexer 30. It is noted that data store outputs data available, address overflow, and power failure are also returned to the state sequencer 14 through condition multiplexer 30 input signals C12–C14 respectively. The $\overline{DO}$ and $\overline{DA}$ outputs are further made available to an external device which may communicate through an interface address register 40 and an interface multiplexer 42 as well as the condition multiplexer 30 with the data processing system 10.

A modulo N prescaler or counter 44 receives an input signal containing pulses which are to be counted and outputs to condition multiplexer input C15 a maximum count signal as it overflows while counting. The prescaler 44 may be reset by the system reset signal. The number of count states of counter 44 will depend upon the particular application and as an example it might receive pulses representing rotations of a watt meter shaft and provide a prescale count such that each MAX count output from counter 44 represents one kilowatt hour of electrical energy.

The data store 12 is advantageously implemented as a small, 256 by 1 core memory having its own internal address counter and operating on read/write cycles of 1500 nanoseconds in duration. Housekeeping connections for the data store 12 include a power detect input which receives 3 volts resistively divided from an 8 volt unregulated input from the power supply. If the input drops below a selected threshold, the data store 12 generates a power failure output which is connected to input C14 of condition MUX to warn of an impending power failure and place the data store 12 in a secure state such that a memory cycle is not interrupted as the data store becomes inoperable from a low power condition. The power failure output may also be communicated to an external device to warn the device of the impending power failure. In some applications, the external device may utilize system pointers or data parameters which must then be communicated to the system 10 through the interface circuitry for storage in data store 12 prior to power shutdown so that these pointers and parameters or other data may be preserved by the nonvolatile core storage of data store 12 during the power failure interval. Upon the reoccurrence of adequate power, the external system may then retrieve this data from the data store 12 to reinitialize itself at the point where the power failure shutdown occurred.

A +5 volt VCC input to data store 12 provides basic power while a ground connection completes the power supply circuit. A 0.1 microfarad capacitor is connected between terminal C0 and C1 for use by an internal voltage boosting circuit and a power resistor connection RP is connected through a 5 ohm resistor to ground to provide control over drive current utilized in the core stack of the data store 12.

The active control connections of data store 12 include an address overflow output, $\overline{AOV}$, which indicates that the internal address counter is at a maximum count of 255 and about to overflow. $\overline{AOV}$ is generated from an overflow latch which is also set by a 600 nsec time out signal when a magnetic feedback timing pulse MFT fails to occur within 600 nsec of a memory read or write part cycle start. $\overline{AOV}$ inhibits memory operating cycles until cleared by the address enable signal $\overline{AE}$. $\overline{AOV}$ activates approximately 650 nsec after the leading edge of $\overline{CI}$ when accessing the last memory location with count $\overline{CT}$ enabled. A data available output provides a pulsed output indicating that data has been read and stabilized at the $\overline{DO}$ output and is available for external use. The leading edge of $\overline{DA}$ occurs no later than 700 nanoseconds after a read, read complement, or write memory access cycle has been initiated by the cycle initiate input signal, $\overline{CI}$. DA is time related to an internal data strobe signal to go active 40 nsec after valid data appears at $\overline{DO}$ and remains active during the remainder of a cycle. It is terminated by an internal end of cycle pulse, $\overline{EOC}$, with a maximum time of 1350 nsec from the leading edge of $\overline{CI}$ to the trailing edge of $\overline{DA}$. $\overline{DO}$ is a bidirectional connection which provides data output during a read cycle and receives data input during a write cycle. Input data must be valid within 200 nanoseconds after the leading edge $\overline{CI}$ and must remain valid until 10 nanoseconds after the leading edge of $\overline{DA}$. Output data is valid 40 nsec prior to the occurrence of the leading edge of signal $\overline{DA}$, 650 nsec after the leading edge of $\overline{CI}$, and remains valid until 20 nsec after the trailing edge of $\overline{DA}$.

The read and write inputs operate in encoded combinations to select one of four operating cycles for data store 12. $\overline{RD}=0$ and $\overline{WT}=1$ commands a read cycle. $\overline{RD}=1$ and $\overline{WT}=0$ commands a write cycle. $\overline{RD}=0$ and $\overline{WT}=0$ commands a read complement cycle in which data is read from an addressed memory location, complemented, presented at output $\overline{DO}$ in complement form and then restored to the selected address location in complement form. $\overline{RD}=1$, $\overline{WT}=1$ commands an address increment cycle during which the address counter is incremented but no data operation takes place. $\overline{RD}$ and $\overline{WT}$ must be valid 100 nanoseconds before the leading edge of $\overline{CI}$ and remain valid for 300 nanoseconds thereafter.

$\overline{CE}$, chip enable, controls a power down condition and when active causes the required components of data store 12 to receive operating power and thereby place the data store in an active condition for receiving a data cycle command. Only a power detect circuit, an $\overline{AE}$ receive circuit, an address overflow circuit and the chip enable circuits remain active during a $\overline{CE}=1$ power down condition. The address counter data is lost during the power down state and must be restored upon initiation of $\overline{CE}$. Furthermore, a time interval of 500 nanoseconds is required between the leading edge of $\overline{CE}$ and the first active input signal. Input $\overline{CT}$ is the count enable input which enables the internal address counter to be incremented at the end of a current memory cycle or at the beginning of an address advance cycle. $\overline{CT}$ must be valid 100 nanoseconds before the leading edge of $\overline{CI}$ and remain valid for at least 300 nanoseconds.

$\overline{AE}$ is an address enable input which causes address inputs MA0-MA7 to be loaded into the internal address counter. It also resets the address overflow signal $\overline{AOV}$. Signal $\overline{AE}$ must have a minimum width of 200 nanoseconds. The address counter is latched by either the trailing edge of $\overline{AE}$ or by the leading edge of the internal memory busy signal, BUSY, if $\overline{AE}$ remains active at cycle initiate time. The address input signals must be asserted and stable 200 nsec before the trailing edge of $\overline{AE}$ and must remain valid for 100 nsec after $\overline{AE}$.

The cycle initiate signal, $\overline{CI}$, initiates a data store operating cycle when the data store is chip enabled and not busy and must have a minimum duration of 100 nsec. For single cycle operation, $\overline{CI}$ has a maximum width of 1000 nsec. As long as $\overline{CI}$ remains active the data store 12 will continuously cycle until disabled by $\overline{CE}$ or $\overline{AOV}$.

In the present example, all input commands to the data processing system 10 must be entered through the condition multiplexer 30. The state sequencer 14 responds to these commands by sequentially sampling the 16 available commands and responding when one is found to be active. A program for sampling these condition inputs is illustrated in Table I. Starting with address location 0, which is forced by a system reset, the sequencer is directed to PROM 16 input address 2 with instruction state I1 active to enable condition multiplexer 30 and condition state 0 active to test condition C0. If condition input C0 is inactive, the sequencer actually advances to address location 2 and from there proceeds to advance to address location 4 while testing the C1 input. However, if the C0 command input is active, the sequencer will advance to location 3 rather than address location 2. Address location 3 contains a branch instruction to PROM address location 64 which will there store the first instruction of a subroutine for responding to the C0 command. As an illustrative example, input command C0 might command the data processing system 10 to add the contents of two bits at address locations 0-1 to the contents of two bits at address locations 4-5 and store the results at address locations 4-6.

If input command C0 is not active, the sequencer is sequenced to address 2 which tests for command input C1. If input C1 is inactive, PROM address 4 causes a branch to address 6 and a test for input C2. However, if input C1 is active, the sequencer actually goes to PROM address 5, which causes a branch to the initial operation of a subroutine corresponding to command input C1, which in the present example might be a read input byte routine located at address location 128. Input C1 might, for example, command the data processing system 10 to read out for an external device 8 bits of data starting with an address location indicated by the internal interface address register 40.

Data Store 12

Figure 2:
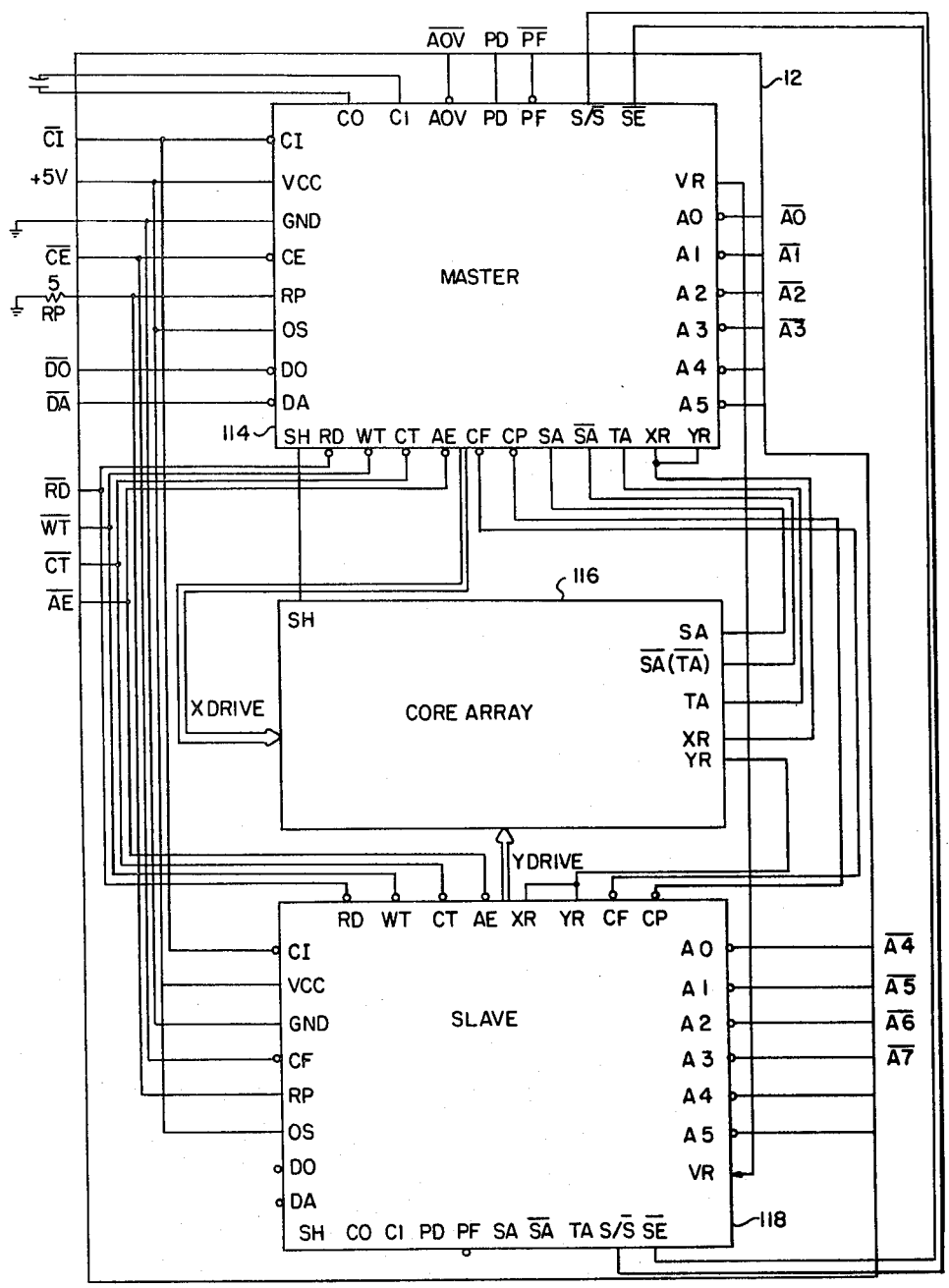
FIG. 2 is a block diagram representation of the data store shown in FIG. 1.

The data store 12 is assembled as a hybrid circuit in a single dual inline package as illustrated in FIG. 2. The data store 12 is comprised of a master silicon chip 114, a core array 116, and a slave silicon chip 118. The master chip 114 and slave chip 118 are identical except that on the master chip an option select input OS is connected to ground while on the slave chip the OS input is connected to +5 volts to configure it as a slave chip. The OS input is actually a three state logic input and, when left unconnected, it configures the chip in a single chip configuration which can drive only a 64 core array rather than the 256 core array 116.

The master chip 114 provides the X drives and sinks, the four least significant bits of the data store address register and most of the timing and control for memory operations. The slave chip provides primarily the drive and sink circuits for the Y drive lines, and the most significant four bits of the data store address register.

Figure 3:
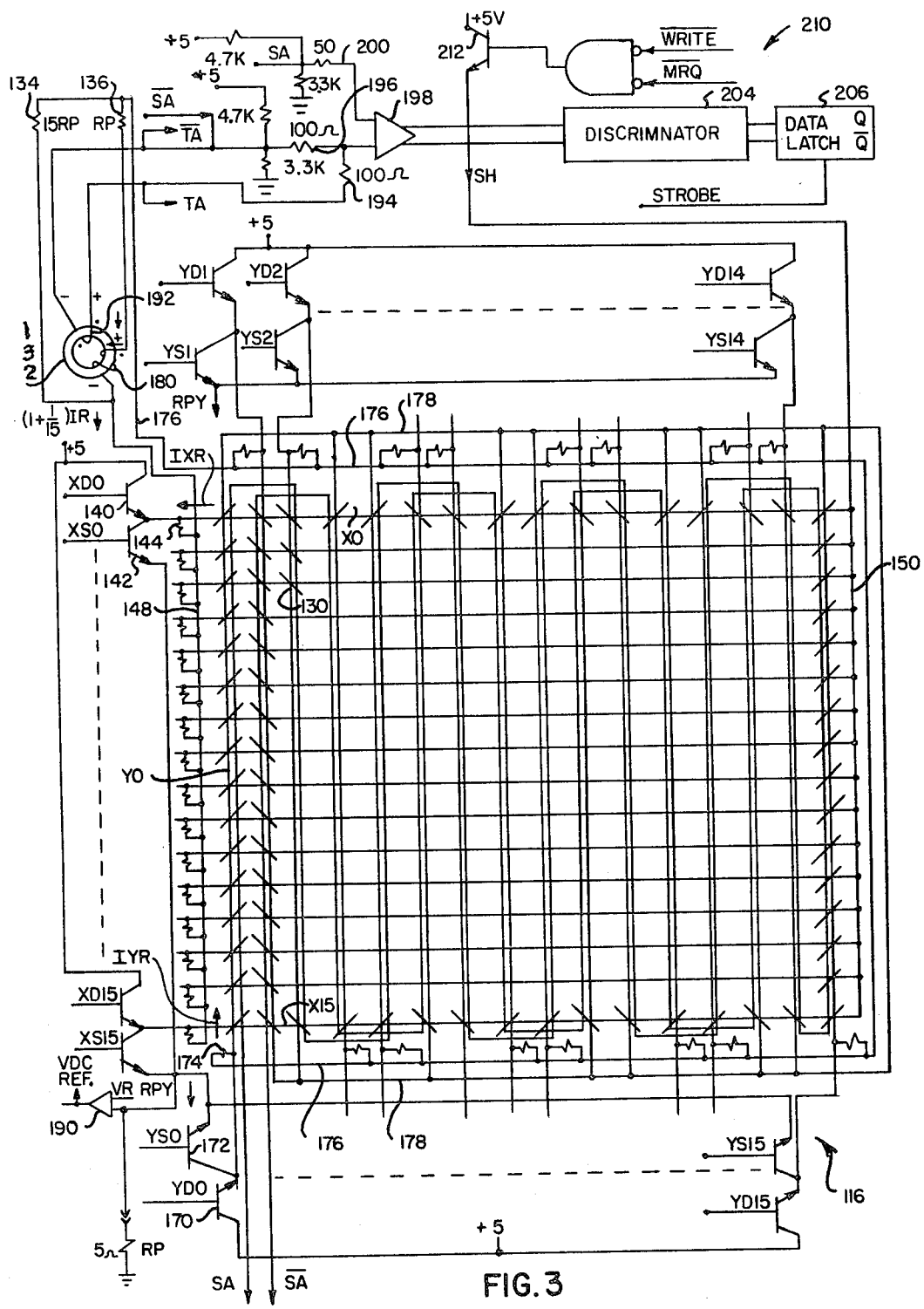
FIG. 3 is a schematic representation of a core array for the data store shown in FIG. 1.

FIG. 3 illustrates the core array 116 as including a 16×16 array of square loop magnetic data storage cores 130. For simplicity, only a sufficient number of cores have actually been drawn to illustrate the double herringbone core pattern in which the cores are aligned. FIG. 3 also illustrates a considerable amount of drive and sensing circuitry for ease of explanation. This external drive and sense circuitry is actually located within the master and slave chips 114, 118, rather than on the core array 116, which includes the memory cores 130, a timing core 132 and two current dividing resistors 134, 136. The cores are Ampex Corporation Model 1323-C cores having a 13 mil outside diameter and a nominal 230 ma full drive current.

The current drive scheme is best illustrated with respect to the X drive lines. Each X drive line X0-X15 has associated therewith a driver transistor 140 with its collector connected to +5 volts and its emitter connected to the associated X drive line and a sink transistor or switch 142 having its collector connected to the associated drive line and its emitter coupled through a 5 ohm current control resistor RP to ground. The base inputs to the switching transistors 140, 142 are connected to a decoder which responds to the address stored within the data store 12 address counter to select a pair of switches associated with a given X drive line and further responds to internal read or write command signals to select either the drive switch 140 or sink switch 142 to control the direction of current through the selected drive line. The drive connection end of each X drive line is further connected through a current splitting resistor 144 to a resistor bus 148 and the opposite ends are connected together at a common bus 150.

During a read part cycle, drive current is presented to the resistor bus 148 in a manner which, as explained below, divides into 16 parts as it flows through the sixteen resistors 144 to the drive ends of the X drive conductors. At the selected X conductor the 1/16th current flows through the selected sink switch 142 through the power resistor to grund. However, in the other 15 unselected X drive conductors the current flows toward the opposite end where it is accumulated at the common bus 150 and flows in the reverse, or right to left, direction through the selected X conductor to join the 1/16th drive current through the resistor associated therewith to flow through the corresponding sink switch 142 and the power resistor to ground.

During a write part cycle, current flow is in the opposite direction with a drive switch 140 turning on to connect the drive end of a selected X drive conductor such as conductor X0 to +5 volts and cause current to flow from the drive end toward the opposite end 1/16th of this current flows through the associated drive resistor 144 to the resistor bus 148. At the opposite end, the current flowing from left to right through the selected X conductor divides as it reaches the common bus 150 into the 15 paths of the 15 selected X conductors. This divided current flows through each of the unselected X conductors in the opposite direction from right to left and then through the associated drive resistors 144 to the resistor bus 148. All of the current is thus collected at the resistor bus.

It is thus apparent that the drive scheme operates to pass drive current through a selected X conductor in a selected direction with the drive current in each case being split equally among the 15 unselected X conductors and flowing backward through the unselected conductors in the reverse direction.

While the drive scheme for the Y conductors appears more complicated than that for the X conductors, it is electrically identical. However, as the core orientation changes for different Y drive lines, the drive end of the line must be physically located at different sides of the array of cores 130. For example, the Y0 drive line couples cores oriented from lower left to upper right and has its drive and sink transistors 170, 172 located at the bottom of the array. For the Y1 and Y2 drive lines the cores are oriented in the opposite direction and the drive and sink switching transistors are at the top of the array. In each case, the drive end of each Y drive conductor is coupled through a drive resistor 174 to a resistor bus 176 and the opposite end is connected to a common bus 178 having all of the opposite ends connected thereto.

During a read part cycle, a selected Y drive switch such as switch 170 for drive line Y0 is turned on to pass current to couple the selected drive line to +5 volts and pass drive current therethrough. 1/16th of this drive switch current passes through the associated drive resistor 174 to the resistor bus 176. The remaining 15/16ths of the switch current, which constitutes the actual partial selection core drive current, passes through the selected drive line to the common bus where it divides 15 ways and passes electrically in the opposite direction through the 15 unselected Y drive conductors from the common end to the drive end where it passes through the associated drive resistors 174 to the resistor bus 176. All of the drive switch current is thus accumulated at the resistor bus 176.

The resistor bus 176 connects to one side of the current splitting resistors 134, 136 with 1/16th of the current passing through resistor 134 and 15/16ths of the current, matching the actual core drive current, passing through resistor 136 and a two turn winding 180 on timing core 132 which is identical to the cores 130 in the core array. After passing through winding 180, the drive current is connected to the X resistor bus 148, as explained previously, from which it divides 15 ways to pass in the opposite direction through the unselected X conductors to the common bus 150 and then through the selected X conductor in the read direction to the sink switch associated therewith and then through the current control resistor RP to ground. The two turns on timing core winding 180 match the drive characteristics thereof of the two passes of the drive current through a selected core in the array in the X and Y direction so that timing core 132 experiences the same magneto motive force as a selected core. It therefore switches exactly in parallel with a selected core.

During a write part cycle, a selected X driver connects the selected X drive conductor to +5 volts with the core drive current passing through the selected X drive conductor from left to right and with the full switch drive current collecting at the resistor bus 148 as explained above. The resistor bus 148 connects to winding 180 of drive core 132 with the write current flowing through winding 180 in a direction opposite to the read current to again switch the timing core 132. The drive current flows through the current dividing resistors 134, 136 to the Y resistor bus 176. At the Y resistor bus, it divides 16 ways with 15/16th of the full current passing to the drive ends of the unselected Y drive conductors and then therethrough in the opposite direction to the common Y bus 178. From this point the current collects and passes in the write direction through the selected Y conductors such as conductor Y0 to the selected Y sink switch 172 and then through the current control resistor RP to ground.

This drive scheme has a number of very important advantages. First, all drive and sink connections are at a single end of the drive lines with the opposite ends being merely connected together. There is thus only a single connection to external circuitry for each drive conductor. Furthermore, each drive conductor is selectively connected through a drive transistor to a +5 volts or through a sink transistor toward ground. These transistors may be saturated, or nearly saturated, to eliminate or reduce voltage drops and resulting power losses thereacross. The traditional decoding diodes are completely eliminated along with the associated voltage drops thereacross and power losses therein. The elimination of these voltage drops helps facilitate driving both the X and Y drive lines with a single current from a +5 volt source while the elimination of the power losses greatly reduces the power which must be dissipated by the driver chips, since a higher source voltage must be used. The serial connection of the X and Y drive currents reduces by one-half the current demand of the drive circuits and, if it is assumed that each of the separate drive currents would otherwise be individually derived from a +5 volt source, the total power consumption of the drive currents is reduced by one-half. At the same time, the reverse currents flowing through the unselected drive lines partially cancels the partial select current flowing through the selected drive lines at unselected cores. As an example, if the core X0, Y0 is selected, the core X1, Y0 receives a partial select Y drive current which is 1/15th cancelled by the opposite flowing partial X drive current in the unselected X conductor X1. The unselected core thus receives only 14/15ths of a partial select drive current rather than a full partial select drive current as in a conventional core memory stack. This partial cancellation greatly improves operating margins. The partial select drive current can now become large enough that partially selected cores would begin walking in a conventional core memory while, in the present arrangement, the partial cancellation may still be sufficient to reduce the partial select current actually experienced by an unselected core and prevent walking. These increased margins help facilitate the use of single chip semiconductor driver circuits which are not capable of providing as precise a control over drive current as the current sources found in conventional core memories.

An amplifier 190 does provide drive current feedback to help stabilize the magnitude of the drive current. Differential amplifier 190 compares the voltage at power resistor RP, which is representative of drive current magnitude, to a voltage reference VR to output a negative feedback signal VDC REF, which is proportional to the difference. This negative feedback signal is utilized to control the base current of the active sink switch transistor 142 or 172, whichever is on, to control the magnitude of the drive current. The voltage reference signal VR is temperature compensated and remains constant at approximately 0.625 volts up to 25° C. and thereafter falls off at a rate of approximately 0.24% per degree C.

The sensing circuit is different from conventional core memory sensing circuits in that it contains no noise cancelling crossovers, and is threaded through the core array in such a way as to provide a unipolar output for core switching signals during read part cycles. That is, all read cores induce a positive voltage at sense line output SA and a negative voltage at sense line output SA. Furthermore, in a conventional core memory, the sense line and parallel drive line are separated by the orthogonal or X drive line passing between them to reduce inductively coupled drive current noise. However, in the present arrangement, the Y conductors and associated sense lines may be threaded simultaneously to reduce cost in view of the small size of the core array and the noise cancellation features inherent in the sense line winding arrangement.

The timing core 132 has a second, single turn, winding 192 wound thereon. This winding 192 corresponds to the single turn coupling of the sense winding SA, SA to a selected core within the array of cores 130. The output of 192 thus tracks as closely as possible the output switching signal experienced by a selected, switched core during a memory part cycle. The output of winding 192 is divided by a pair of 100 ohm resistors 194, 196. One-half of the output of winding 192 is thus presented across the input terminals of a differential amplifier 198 in a path which extends across resistor 196 to the SA terminal of the sense winding, through the sense winding to the SA terminal thereof and then through a 50 ohm resistor 200 to the negative terminal of amplifier 198.

The core switching voltage of a selected core is thus coupled in series with one-half the core switching voltage of winding 192 for timing core 132 but with opposite polarities. Hence, if a 1 is read, the net signal presented to the input of sense amplifier 198 is one-half of a core switching output signal with a positive polarity. On the other hand, if a selected core does not switch, the signal presented to the input of sense amplifier 198 is still one-half of a core switching output signal, but with a negative polarity. As the core switching output signal changes in magnitude with factors such as temperature and drive current, the signal magnitudes may change considerably but the read 1 and read 0 net or difference switching signals presented to the input of sense amplifier 198 still remain mirrored about 0 volts with a positive signal representing the switching of a selected core and a negative voltage representing the nonswitching of a selected core. Zero volts thus remains the optimum sensing threshold point for detecting a 1 or a 0 selected core output. The resultant effect of subtracting one-half the timing core switching signal from the selected core switching signal is to dynamically adjust the sensing voltage threshold in response to changing core switching signal conditions. At the same time, the actual threshold remains at 0 volts differential, a threshold which is very easy to implement with great stability. The output of the sense amplifier 198 is communicated differentially to a discriminator 204 which distinguishes between 1 and 0 switching signal outputs and sets a data latch 206 accordingly upon receipt of a strobe timing signal.

Although not shown in FIG. 3, the strobe timing signal may also be generated in response to the timing core output switching signal from winding 192. The strobe signal thus may be generated at the actual peak of the core switching signal for maximum noise immunity. By tracking the actual core switching signals, the timing of the strobe signal may be optimized notwithstanding changes in the core switching signal characteristic with factors such as temperature and drive current.

A shunt circuit 210 including a shunt switching transistor 212 is actuated when writing a 0 (not switching a core) during a write part cycle. When a 0 is to be written, the Y sink switch at the selected Y address is turned on but no corresponding X drive switch is turned on. Instead, shunt transistor 212 is turned on to connect the X common bus 150 to +5 volts. From this point, the current divides to pass in the reverse direction through all 16 unselected X drive wires and through the associated drive resistors 144 to the X resistor bus 148. From this point, the current flows in the write direction through timing core 192 to switch timing core 192 in preparation for the next read part cycle to the Y resistor bus 176. From this point, the current follows a normal Y current path for a write part cycle. It flows through the drive resistors 174 to the drive ends of the 15 unselected drive conductors and then in the reverse direction to the common bus 178 at the opposite end. From this point, the current flows through the selected Y conductor in the write drive direction to the Y sink switch 172 associated therewith and then through the power resistor RP to ground. In this way a selected core receives only a single partial select current, which is partially cancelled, and the selected core does not switch when a 0 is to be written. At the same time, the timing core winding 180 receives a partial select current through the turns thereof which cause it to switch in preparation for the next read cycle.

Figure 4:
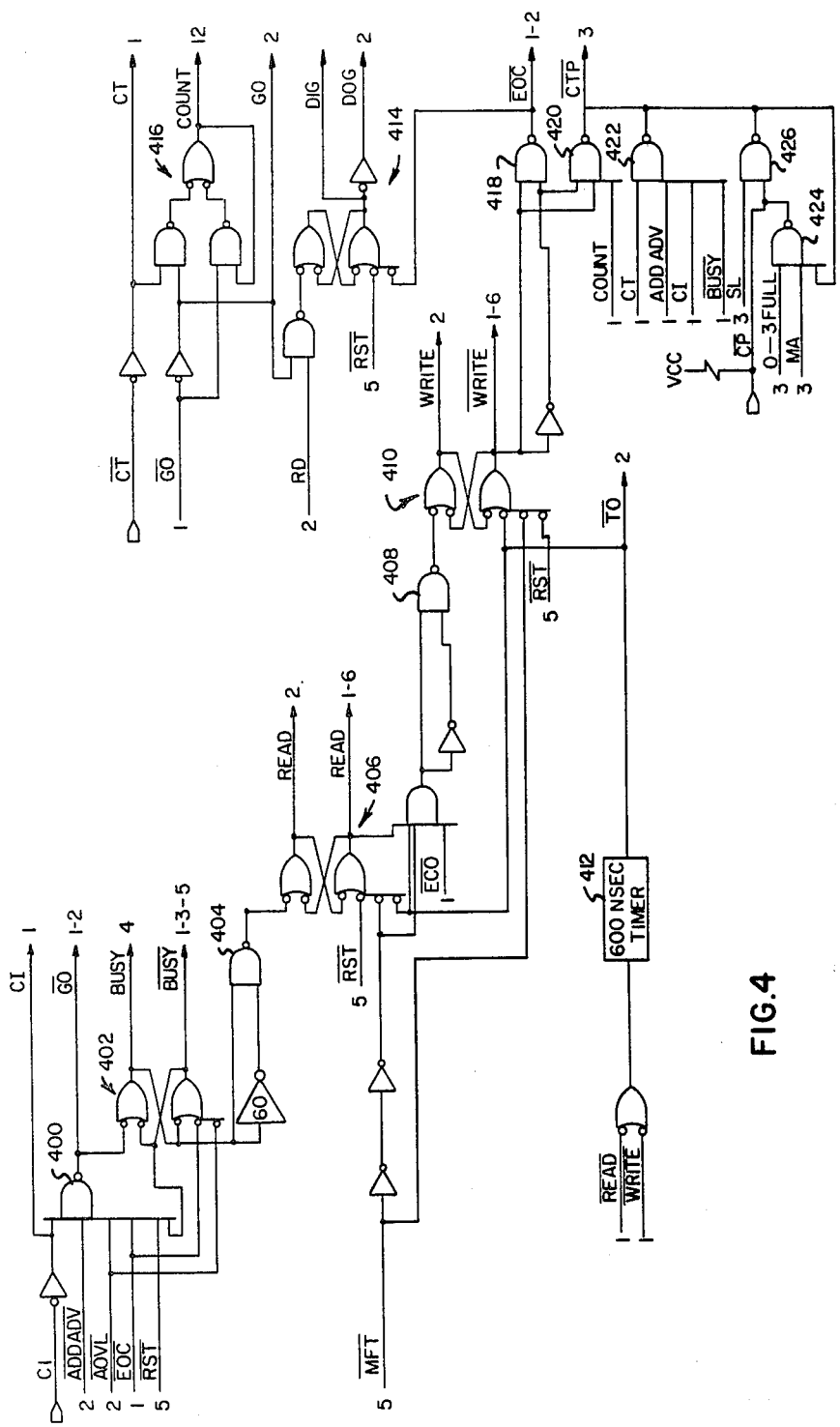
FIG. 4 is a schematic and block diagram representation of control logic for the data store shown in FIG. 1.

Referring now to FIG. 4, there is shown the cycle start and master control circuitry producing the read and write controls for the data store 12. A data cycle begins with the assertion of a signal $\overline{GO}$ at the output of a NAND gate 400 when the external cycle initiate signal is activated while an address advance signal, $\overline{AD\text{-}DADV}$, an address overflow signal, $\overline{AOVL}$, an end of cycle signal, $\overline{EOC}$ and a reset signal $\overline{RST}$, are all at logic 1. These enabling signals define a state at which any previous memory cycle has ended and the memory is ready to begin a new cycle, which is begun with the assertion of signal $\overline{CI}$. The signal $\overline{GO}$ which initiates a new cycle sets a busy latch 402 which remains set throughout the memory cycle until reset by the end of cycle signal $\overline{EOC}$ or a system reset signal $\overline{RST}$. The leading edge of the busy signal generates a 60 nanosecond pulse at the output of a NAND gate 404 which is connected to set a read latch 406. The read latch 406 outputs a signal READ which commands the current drivers and related circuits to actually perform a read part cycle.

A signal $\overline{MFT}$ or magnetic feedback timing is generated by comparing the output switching signal from output winding 192 of timing core 132 to a threshold set at approximately 10% of the nominal maximum peak voltage of the output switching signal. Signal $\overline{MFT}$ thus has a leading edge as the timing core switching signal rises above the 10% threshold and a trailing edge as the timing core switching signal voltage drops below this 10% threshold. Upon the occurrence of the trailing edge of $\overline{MFT}$, two inverter gates provide a 40 nanosecond delay and then reset the read latch 406 to terminate the read part cycle. The 40 nanosecond delay assures that the selected core is fully switched in the read direction to provide a uniform, fully switched flux state for the beginning of any subsequent write part cycle. The trailing edge of the read signal generates a 60 nanosecond pulse at a NAND gate 408 which sets a write latch 410. Write latch 410 generates a write output signal which commands the current drivers to turn on to proceed with a write part cycle. The write latch 410 is turned off by the magnetic feedback timing signal generated by timing core 132 as it switches during the subsequent write cycle but without the additional 40 nanosecond delay. A 600 nanosecond timer 412 is actuated by each occurrence of a read cycle or a write cycle and generates a time out signal TO which resets both the read latch 406 and the write latch 410 in the event that the magnetic feedback timing signal does not reset them within 600 nanoseconds. This prevents a current driver runaway condition which might damage the driver circuitry in the event that, for some reason, the timing core 132 does not produce an output switching signal which is sensed to generate the magnetic feedback timing signal. It will be appreciated that the very first time the memory is cycled the timing core may not be in the proper state to produce an output switching signal. At other times, misuse of the I/O commands, a large noise signal or other defect may interfere with the magnetic feedback timing signal.

A data gating latch 414 responds to the system input read command signal, $\overline{RD}$, to generate a data input gate signal, DIG, and the complement thereof, a data output gate signal, DOG. A count latch 416 is set to enable the incrementing of the address counter upon the completion of a memory cycle when the input count enable signal $\overline{CT}$ is asserted in conjunction with the cycle start signal, $\overline{GO}$. Once asserted, the count signal is latched until signal $\overline{GO}$ goes active low at the beginning of a cycle without signal $\overline{CT}$ being asserted. A NAND gate 418 generates the end of cycle signal, $\overline{EOC}$, as a 100 nanosecond pulse occurring at the trailing edge of the write control signal, WRITE. During this same time interval, a NAND gate 420 asserts a count pulse signal, CTP, which actually increments the address counter at the end of a memory cycle when enabled by the signal COUNT. Alternatively, a NAND gate 422 asserts the signal CTP at the beginning of a memory cycle when the assertion of $\overline{WT}$ and $\overline{RD}$ command an address advance memory cycle during which no data operation occurs. A pair of NAND gates 424 and 426 provide communication of a generated count pulse signal from the master chip to the slave chip in a dual chip configuration.

Figure 5:
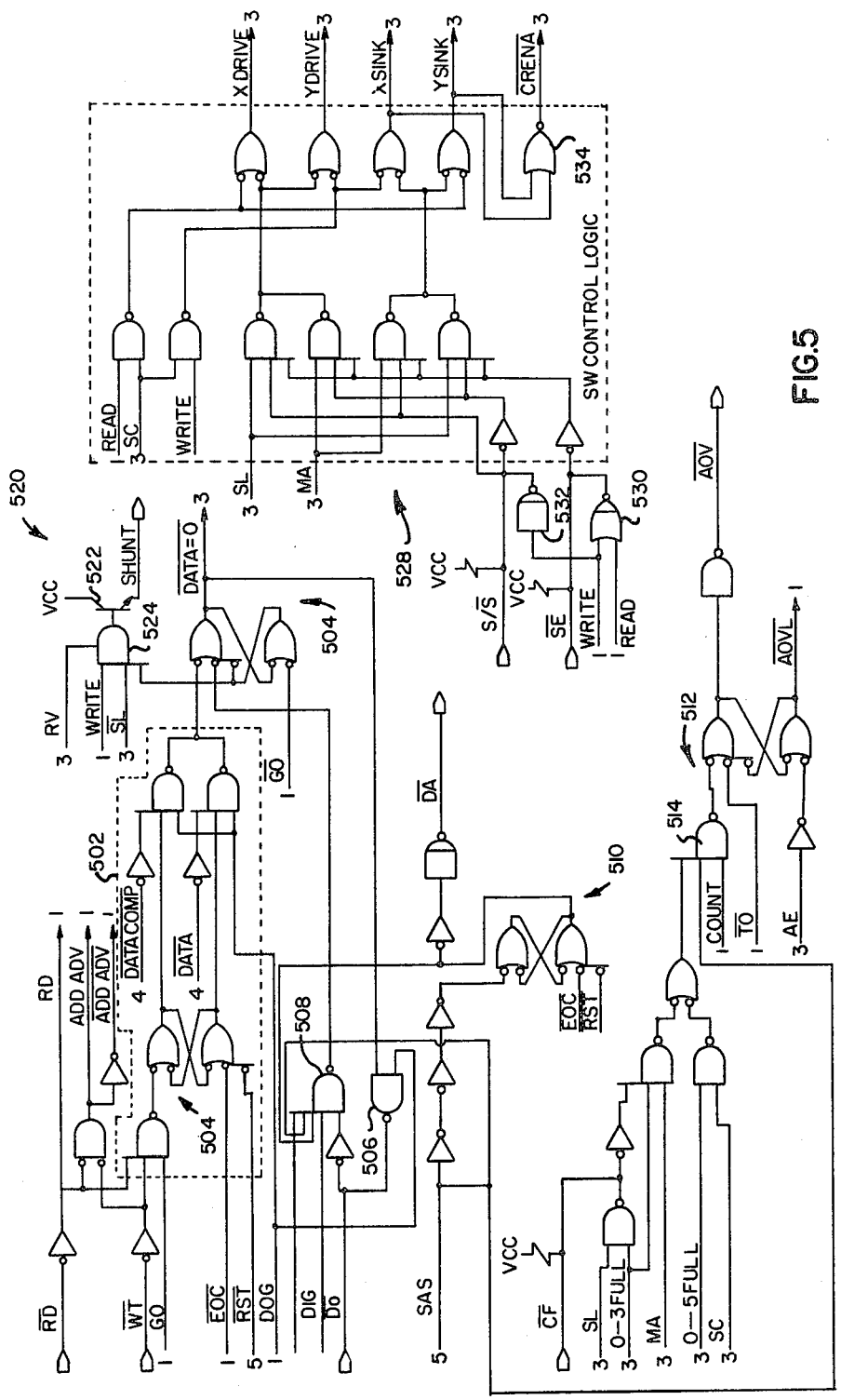
FIG. 5 is a schematic representation of a portion of the control logic including the selective data inverter circuit for the data store shown in FIG. 1.

Referring now to FIG. 5, there is shown an inverter circuit 502 including an inverter latch 504 which is coupled to be set by the concurrent assertion of the read and write signals while pulsed by signal GO. The inverter latch is coupled to be reset by the end of cycle signal, $\overline{EOC}$ or the reset signal $\overline{RST}$. Inverter circuit 502 receives both true and complement data from the data latch 206 and passes true data to a data store latch 504 when reset and complement data to data latch 504 when set. Data latch 504 is coupled to drive the DO output terminal through a NAND gate 506 which must be further enabled by a data output gate signal, DOG. Data latch 504 is also coupled to receive the input data from the $\overline{DO}$ data terminal from a NAND gate 508 when NAND gate 508 is enabled by the concurrence of a data input gate strobe signal, DIG, SAS, and a complement output from a latch 510 which is coupled to be set by $\overline{SAS}$ delayed by 60 nanoseconds and reset by signal $\overline{EOC}$ or $\overline{RST}$.

An overflow latch 512 is coupled to be set by the output of NAND gate 514 when the address counter is full for the particular one or two chip configuration in which the memory is used when signal COUNT is present concurrently with the sense amplifier strobe signal SAS. Latch 512 is further coupled to be reset by the 600 nanosecond time out signal, $\overline{TO}$. Address latch 512 is coupled to be reset by the address enable signal, $\overline{AE}$. The shunt circuit 520 includes a drive transistor 522 connected to +5 volts and with its base driven by an AND gate 524 which turns on drive transistor 522 during a write cycle when the data latch 504 indicates that a data bit 0 is to be written. AND gate 524 is disabled on the slave chip in a two chip configuration by signal $\overline{SL}$. A drive direction control circuit 528 operates to actuate the X drive, Y drive, X sink and Y sink drive control signals to properly turn on the current direction drivers in accordance with whether a read part cycle is in progress, a write part cycle is in progress and whether the given chip is in a single chip configuration, a slave configuration, or a master configuration. A NOR gate 530 on the master chip communicates a selection enable signal, $\overline{SE}$, from the master chip to the slave chip to enable the drive selection output on the slave chip. Similarly, an inverter gate 532 is connected to send a signal S/$\overline{S}$ from the master chip to the slave chip to indicate whether or not a write part cycle is in progress. On the slave chip only the direction control circuitry is power enabled while the gates 530 and 532 remain in a power down condition and are inoperative. The direction control circuit 528 further includes a NOR gate 534 which generates a current enable signal, $\overline{CRENA}$, whenever either the X sink signal or the Y sink signal is true.

Figure 6:
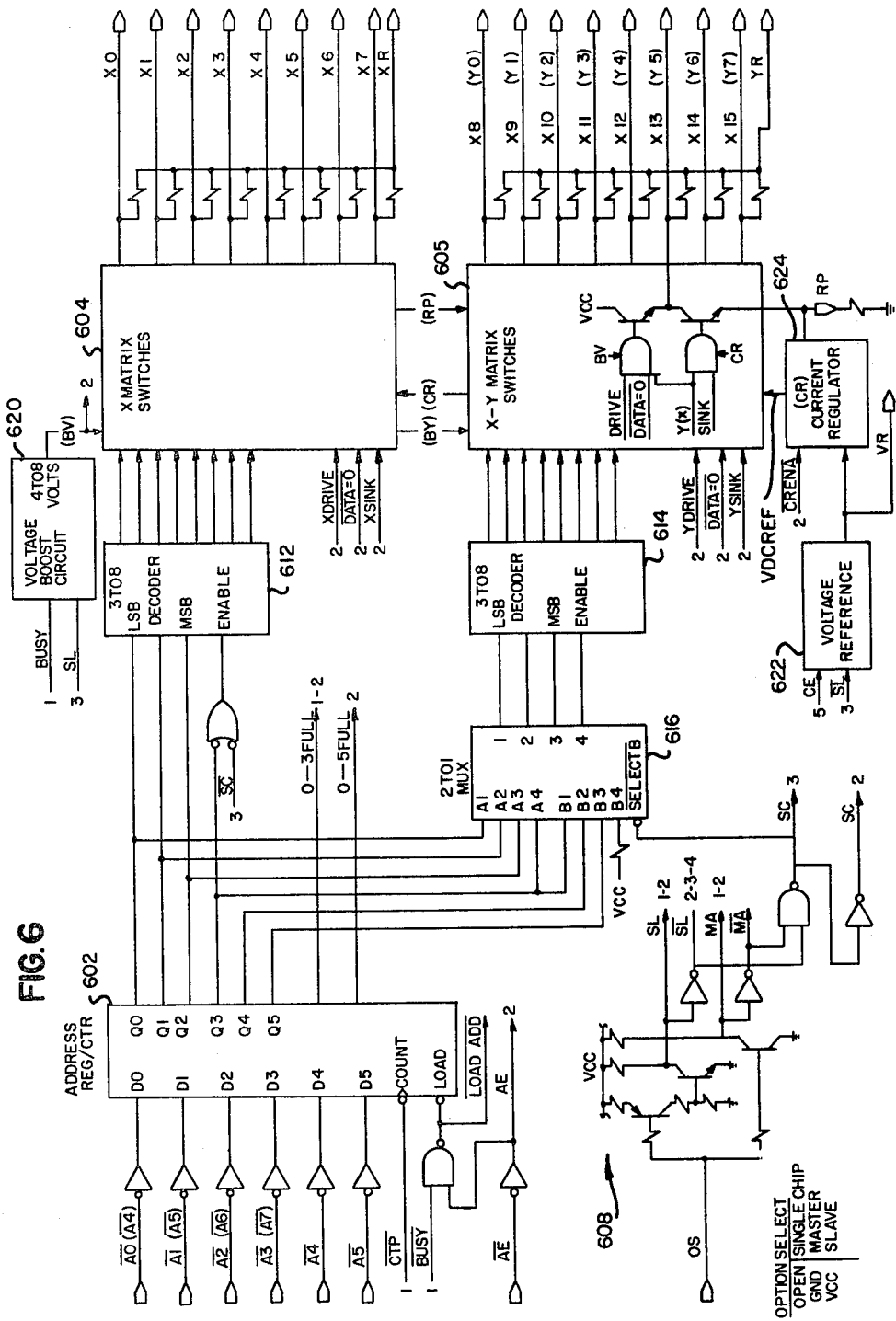
FIG. 6 is a block diagram and schematic representation of address counter, driver and decoder circuits for the data store shown in FIG. 1.

FIG. 6 illustrates, in block diagram form, the address store 602 which is implemented as a 6 bit counter, the X matrix switches 604, the X-Y matrix switches 605, and an option select circuit 608 which generates the master, slave, and single chip control signals in response to the terminal option select signal, OS. In the single chip configuration, address counter 602 receives the six address signals A0-A5. In a master configuration, it receives the address signals A0-A3 and in a slave configuration it receives the most significant address signals A4-A7. To accommodate the different configurations a 0-3 FULL signal goes active when the address counter 602 stores a 1 or maximum count in locations 0-3 for a two chip configuration and generates a 0-5 FULL signal when the address counter 602 stores a logic 1 maximum count in all six storage locations 0-5 for use in a single chip configuration. Counter 602 is coupled to be incremented by the count pulse signal, $\overline{CTP}$ and to be loaded with external address signals in response to the address enable signal, $\overline{AE}$, when enabled by signal $\overline{BUSY}$. Decoders 612, 614 decode the three address input signals to matrix switches 604, 605 respectively. Decoder 614 is coupled to receive address inputs through a multiplexer 616 which responds to the single or dual chip configuration to properly direct address signals to decoder 614. It will be appreciated that, in a single chip configuration, X matrix switches 604 drive eight X conductors while X-Y matrix switches 605 drive eight Y drive conductors. In a master chip configuration both of the matrix switches 604, 605 drive the 16 X conductors and in a slave configuration both of the matrix switches 604 and 605 drive the 16 Y conductors.

A voltage boost circuit 620 utilizes the external capacitor at terminal C0, C1 to boost the VCC input voltage to 8 volts for use by the current driver switches. The voltage boost circuit is enabled only while the data store 12 is in a busy condition and is not enabled on the slave chip. A voltage reference circuit 622 is enabled only on the master chip in response to the chip enable signal $\overline{CE}$ and generates a voltage reference signal, VR, which is utilized on both the master chip and the slave chip by a current regulator 624 to control the base current supplied to the active X or Y sink switch to control the magnitude of the drive current through a selected core. The voltage reference signal VR is controlled to remain constant at approximately 0.6125 volts up to 25° C. and then to decrease at a rate of 0.24% per degree C. up to 125° C.

Figures 8, 9:
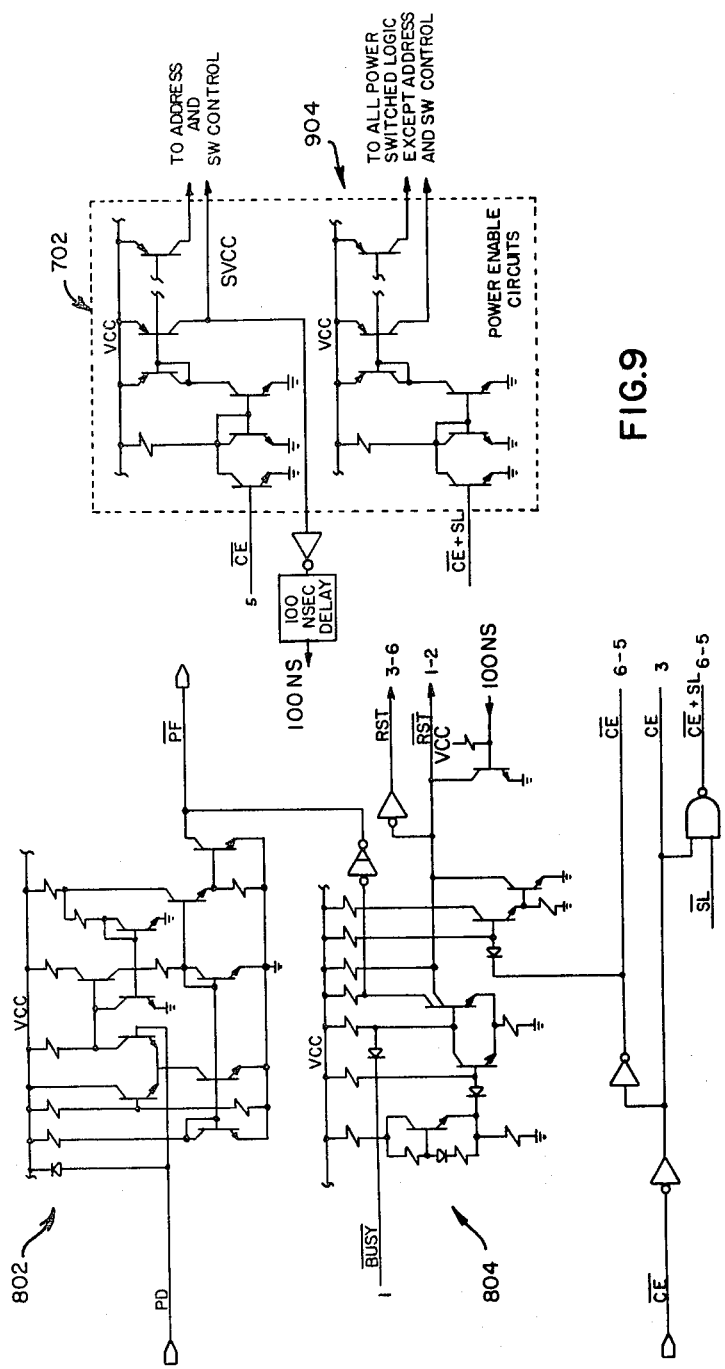
FIG. 8 is a schematic diagram representation of reset and power failure detection circuits for the data store shown in FIG. 1.
FIG. 9 is a schematic diagram representation of selectively enabled power supply circuits for the data store shown in FIG. 1.

FIG. 8 illustrates a power detect circuit 802 which operates to generate the power flag output signal, $\overline{PF}$, when the power detect input signal PD drops below a threshold voltage. A reset circuit 804 operates to generate the memory reset signal $\overline{RST}$ in the absence of the chip enable signal, $\overline{CE}$, and at power turn on.

Referring to FIG. 9, there is illustrated for completeness the two +5 volt power distribution circuits which include a slave circuit 902 which is operative on both the master and slave chips in response to chip enable signal, $\overline{CE}$. A second power distribution circuit 904 is operative only on the master chip in response to signal CE and $\overline{SL}$ to distribute +5 volts to the circuits which receive power on the master chip but not on the slave chip. The slave VCC reference, SVCC is communicated to the reset circuit 804 in FIG. 8 to implement a power on reset, which assures that the reset signal does not terminate until DC power has stabilized.

Figure 10:
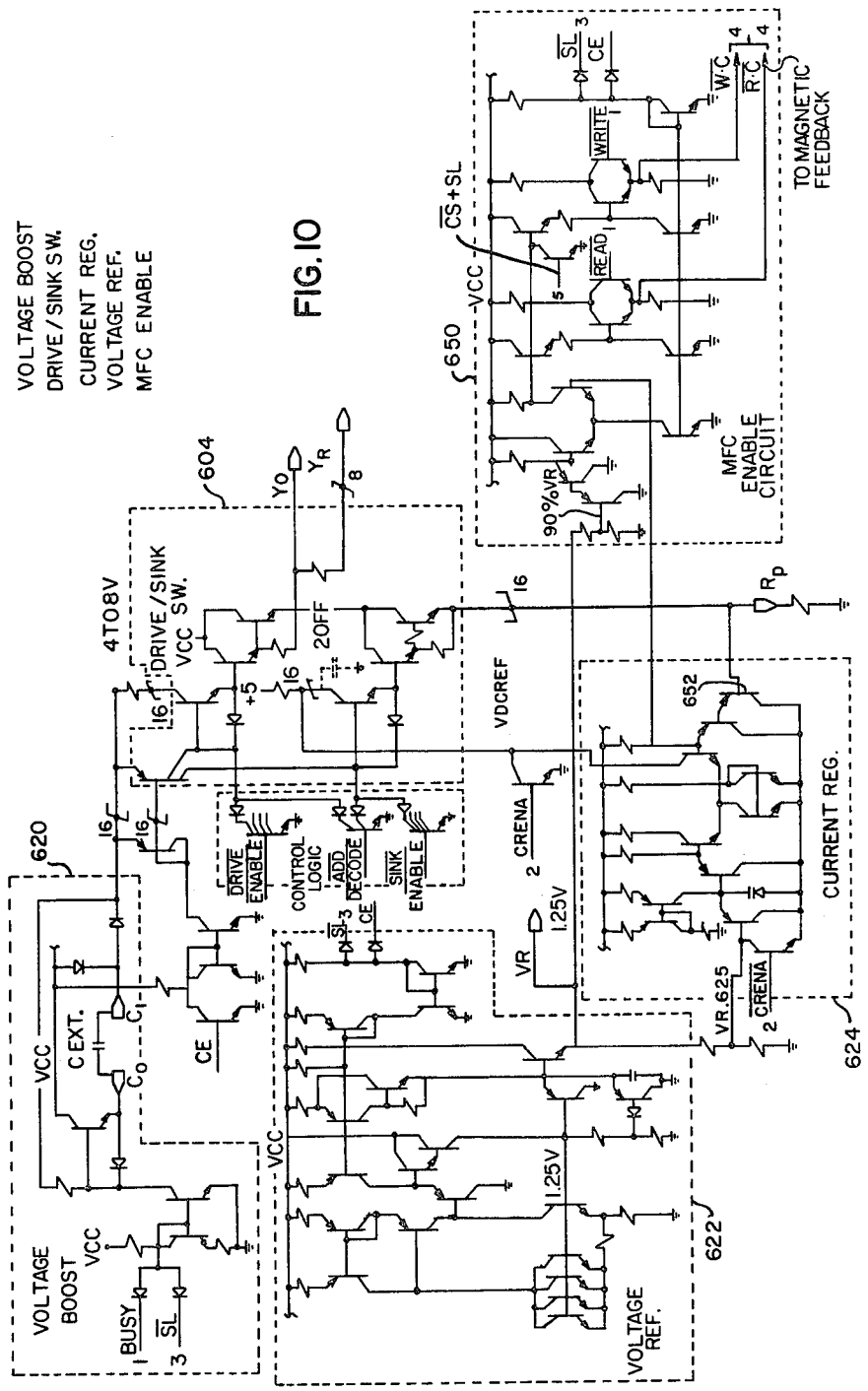
FIG. 10 is a schematic representation of the driver circuits shown in FIG. 6.

FIG. 10 illustrates in greater detail the voltage boost circuit 620, the voltage reference circuit 622, the current regulator circuit 624 and a sample representation of drive sink matrix switch 604. FIG. 10 also illustrates a magnetic feedback circuit enable circuit 650 which generates signals $\overline{WC}$ when drive current exceeds 90% of nominal during a write signal and signal $\overline{RC}$ when drive current exceeds 90% of nominal value during a read cycle.

The current regulator compares the reference voltage to the voltage at the RP power resistor to generate a signal VDCREF which conducts current at a transistor 652 when the resistor voltage exceeds the reference voltage to bleed base supply current away from the base of the selected sync driver transistor to thereby reduce the core drive current until the voltage at the power resistor matches the reference voltage.

Figure 7:
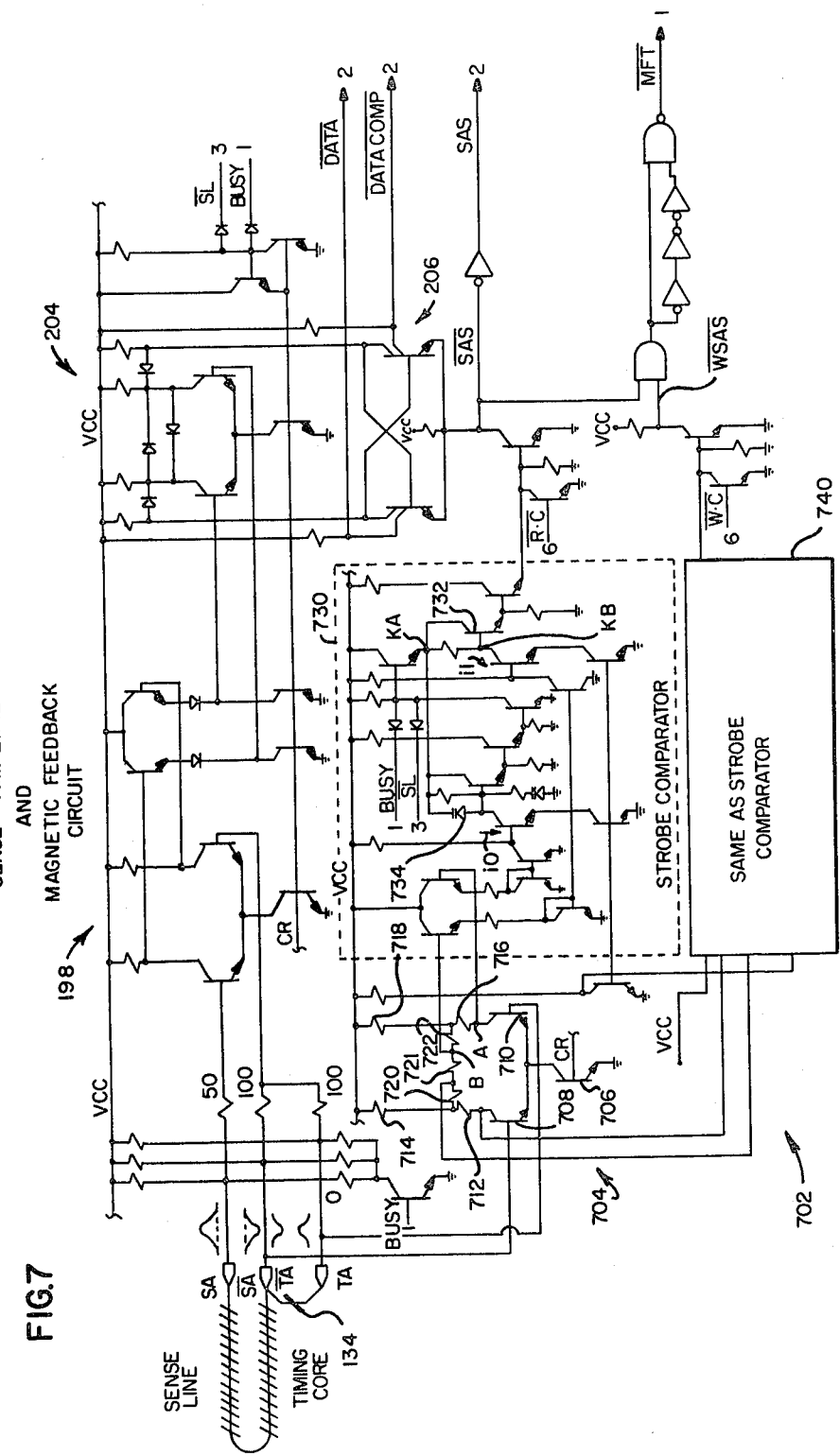
FIG. 7 is a block diagram and schematic representation of sense amplifier and magnetic feedback circuits for the data store shown in FIG. 1.

Referring to FIG. 7, the sense amplifier 198 receives and amplifies the difference sense signal representing the difference between the selected core output switching signal and one-half the timing core output switching signal. The amplifier or discriminator 204 receives the amplified differential difference signal and when latch 206 is enabled by the sense amplifier strobe signal, $\overline{SAS}$, causes latch 206 to set in one condition or another to reflect the sensed data. Two complementary signals $\overline{DATA}$ and $\overline{DATA\ COMP}$ are taken as outputs for use by the selective inverter circuit.

Figure 11:
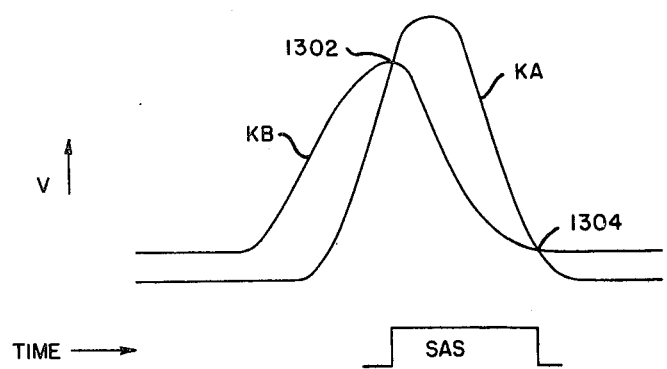
FIG. 11 is a representation of two voltage waveforms illustrating the operation of a peak detector for the data store shown in FIG. 1.

The magnetic feedback circuit 702 responds to the timing core output switching signal by generating two amplified switching signals, as illustrated by curves KA and KB in FIG. 11. Curve KA has a negative offset relative to curve KB, but a larger gain, and is delayed slightly relative to curve KB. Consequently, curve KA rises above curve KB at point 1302 to define the leading edge of the sense amplifier strobe signal, SAS. At time 1304, the magnitude of curve KA falls below the magnitude of curve KB to terminate signal SAS.

Returning now to FIG. 7, an input differential amplifier 704 receives the timing core switching signal from the TA and TA terminals of the timing core sense winding. Amplifier 704 includes a current source 706 and a pair of differential amplifier transistors 708, 710. The collector of transistor 708 is connected through a resistor 712 and a load resistor 714 to +5 volts. Similarly, the collector of transistor 710 is connected through a resistor 716 and a load resistor 716 to +5 volts. Three resistors 720, 721 and 722 are connected in series between the load resistors 714, 718. The center of resistor 721 is an AC virtual ground so that resistors 721 and 722 operate as an AC voltage divider network to reduce the gain at point B relative to the gain at the load resistor 718, thus reducing the AC gain. Resistor 716 provides a DC voltage drop relative to the load resistor 718 and point B without reducing the AC gain.

We thus have voltage at points A and B corresponding to the curves KA and KB in FIG. 11 except for the time delay imposed on curve KA. The resistors 720, 721, 722 and 716 are selected to provide point A with a DC offset voltage equal to approximately 10% of a nominal peak switching signal magnitude as sensed at point B and to provide a signal amplification at point A which is 1.2 times greater than the signal amplification at point B.

A strobe comparator receives the signals from points A and B, amplifies them by a factor K at points KA and KB respectively and compares then at transistor 732 to generate the sense amplifier strobe signal SAS. A capacitor 734 operates to delay slightly the signal at point KA to produce voltage waveforms at points KA and KB as shown in FIG. 11. A signal $\overline{RC}$ enables sense amplifier strobe when drive currents are above 90% of nominal magnitude and a read part cycle is in progress.

A second strobe comparator 740 is the same as comparator 730 except that the polarity of its inputs is reversed to permit it to respond to the negative polarity switching signal which occurs during a write cycle. The resulting $\overline{WSAS}$ output signal operates to generate $\overline{MFT}$ to turn off the drive currents during a write part cycle. $\overline{WSAS}$ is enabled by a signal $\overline{WC}$ which is similar to RC except that $\overline{WC}$ occurs during a write part cycle.

Figure 12:
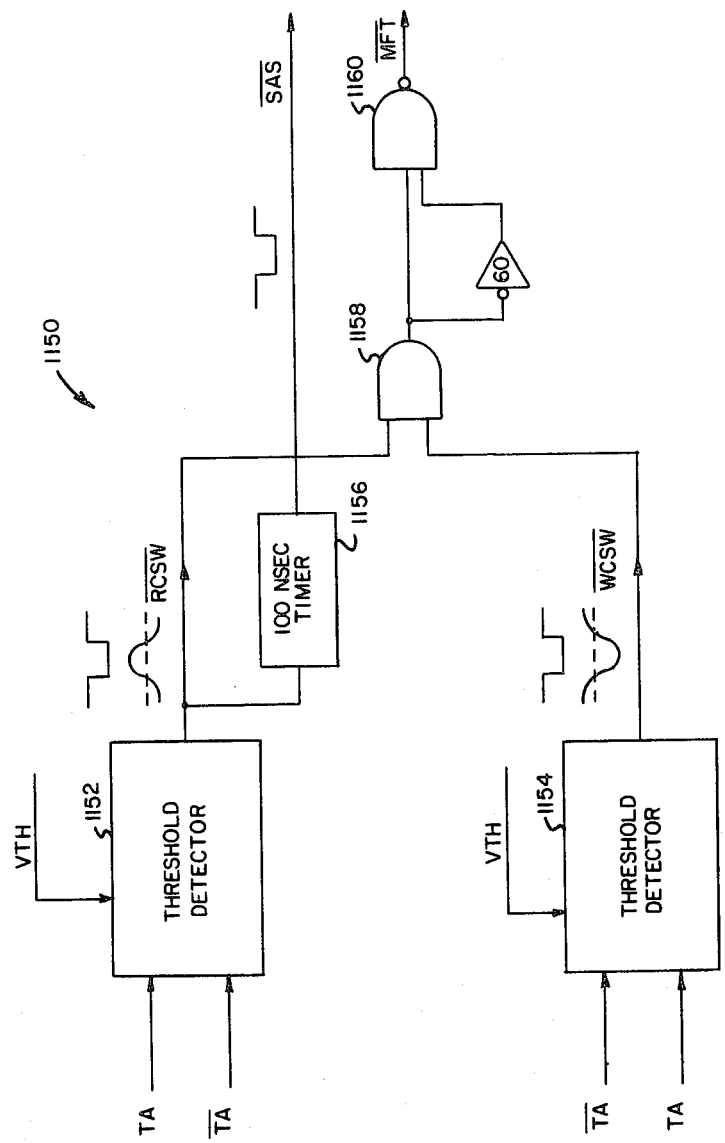
FIG. 12 is an alternative arrangement of a magnetic feedback circuit in accordance with the invention.

An alternative arrangement of a magnetic feedback circuit 1150 is illustrated in FIG. 12. Circuit 1150 includes two threshold detectors 1152 and 1154 and a 100 nsec timer 1156. The threshold detector 1152 operates during a read cycle to generate a read part cycle switching output signal $\overline{RCSW}$ which remains active so long as the positive timing core output signal exceeds a threshold level which is determined by a signal VTH to be approximately 10% of the nominal peak switching voltage.

Threshold voltage detector 1154 is identical to detector 1152 except that the input polarities are reversed to accept the negative output voltage switching signal which occurs during a write part cycle. The write core switch output signal, $\overline{WCSW}$, is communicated to an AND gate 1158 and a NAND gate 1160 which also receive the signal $\overline{RCSW}$ to generate a 60 nsec pulse, $\overline{MFT}$, at the trailing edge of either $\overline{RCSW}$ or $\overline{WCSW}$ to terminate a memory part cycle.

The 100 nsec timer 1156 is operative only during a read part cycle to generate a sense amplifier strobe output signal, $\overline{SAS}$, 100 nsec after the leading edge of $\overline{RCSW}$. Signal $\overline{SAS}$ terminates at the trailing edge of $\overline{RCSW}$.

While the fixed timing peak detector 1156 will not follow the switching signal peak quite as precisely as a circuit sensing the actual peak, its responsiveness to the 10% point on the rising edge of the switching signal permits time adjustments to actual switching conditions and affords reasonable accuracy. At the same time, the magnetic feedback timing signal, $\overline{MFT}$, is more precisely responsive to the preferred 10% point on the falling edge of the switching signal and the circuitry is somewhat simpler.

Figure 13:
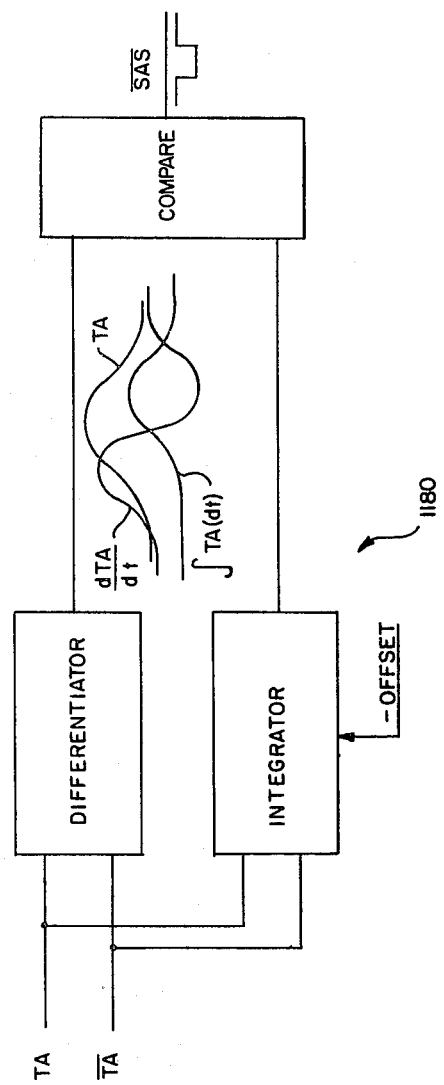
FIG. 13 is another alternative arrangement of a magnetic feedback circuit in accordance with the invention.

FIG. 13 illustrates still another magnetic feedback circuit arrangement 1180 in which the timing core switching signal is both differentiated and integrated. A negative offset is imposed upon the integrator so that its output exceeds the differential output signal at the switching signal peak. A comparator generates the signal $\overline{SAS}$ when the magnitude of the integrated output signal exceeds the magnitude of the differentiated output signal. Signal $\overline{MFT}$ would be generated as a pulse at the trailing edge of $\overline{SAS}$.

While there have been described above various arrangements of a core memory with a feedback timing signal generating circuit for the purpose of enabling a person of ordinary skill in the art to make and use the invention, it will be appreciated that the invention is not limited thereto. Accordingly, any modifications, variations or equivalent arrangements within the scope of the attached claims should be considered to be within the scope of the invention.

What is claimed is:

1. A core memory comprising:
 a data storage stack including an array of data storage cores and a timing core coupled to receive substantially the same magnitude of drive current as a selected data storage core;
 a timing core sensing circuit coupled to sense the switching signal output of the timing core and generate a feedback switching signal corresponding thereto as the timing core is switched by the drive current;
 current drive circuitry coupled to drive a selected data storage core and the timing core with currents of sufficient magnitude to switch the cores from one state of magnetization to another in response to current command signals; and a timing and control circuit responsive to address and data commands and to the feedback switching signal for generating the current command signals required to switch selected data storage cores.

2. The core memory according to claim 1 above, wherein the timing and control circuit includes a reference circuit generating a reference voltage and a comparator coupled to compare the feedback switching signal with the reference voltage and generate a magnetic feedback timing signal when the magnitude of the feedback switching signal becomes less than the reference voltage during a memory part cycle; the timing and control circuit being further coupled to determine core drive current duration upon the occurrence of the magnetic feedback timing signal during a memory part cycle.

3. The core memory according to claim 2 above, wherein the reference voltage is set at approximately 20% of the peak feedback timing signal voltage at 25° C.

4. The core memory according to claim 1, 2 or 3 above, further comprising a data core sensing circuit coupled to sense a data core output switching signal of a selected data core and store a data state indicating the state of the data core output switching signal upon the occurrence of a strobe signal.

5. The core memory according to claim 4 above, further comprising a peak detector coupled to detect the occurrence of a peak voltage in the feedback switching signal and generate the strobe signal in response thereto.

6. The core memory according to claim 4 above, further comprising a strobe circuit coupled to generate the strobe signal in response to a condition of the feedback switching signal indicating that the timing core has substantially completed switching.

7. The core memory according to claim 4 above, wherein the data core sensing circuit is coupled to subtract one-half the timing core output switching signal from the selected data core output switching signal to obtain a difference signal and, upon the occurrence of the strobe signal, indicate a data state dependent upon whether the difference signal is greater than 0.

8. The core memory according to claim 7 above, further comprising means responsive to the feedback switching signal for generating the strobe signal at approximately the time the feedback switching signal reaches a peak voltage.

9. The core memory according to claim 6 above, wherein the strobe circuit includes an integrator circuit and a differentiator circuit responsive to the feedback switching signal and a comparator coupled to generate the strobe signal when the integral of the feedback switching signal exceeds the derivative of the feedback switching signal during a memory part cycle.

10. A core memory comprising:
a data storage stack including an array of data storage cores and a timing core coupled to receive substantially a same magnitude of drive current as a selected data storage core;
current drive circuitry coupled to drive a selected data storage core and the timing core with drive currents that are sufficient to switch the cores from one magnetic state to another during memory part cycles; and
a sensing circuit coupled to sense the difference between an output switching signal of a selected data core and one-half the output switching signal of the timing core and to indicate whether the difference is greater than zero at a point in time approximately coincident with the occurrence of a peak magnitude of the timing core switching signal.

11. The core memory according to claim 10 above, wherein the sensing circuit is coupled to the array of data storage cores in a configuration resulting in a unipolar output core switching signal for all data cores of the array during a read part cycle.

12. A core memory that is highly adaptive to changes in core drive current magnitude and core array temperature, input voltage and timing variations comprising:
a magnetic core array including a plurality of data storage cores and a timing core;
drive circuitry coupled to drive a selected data storage core and the timing core with substantially equal drive currents sufficient to cause switching from one state of magnetization to another during a read part of a memory cycle;
a peak detector coupled to sense the occurrence of a peak in a switching signal generated by the timing core during a read part cycle and to command the sensing of a selected data core output switching signal upon the occurrence of the peak;
and a sensing circuit coupled to sense the magnitude of a selected data core output switching signal and to indicate as data output the condition of the data core output switching signal upon the occurrence of a command from the peak detector indicating a peak in the timing core output switching signal.

13. The core memory according to claim 12 above, wherein the sensing circuit includes a threshold detector coupled to generate an output signal when the timing core output switching signal exceeds 10% of the nominal peak magnitude thereof and a timing circuit coupled to generate a pulse sense amplifier strobe signal a fixed time after the leading edge of the threshold detector output signal.

14. A core memory that is highly adaptive to changes in core drive current magnitude and core array temperature, input voltage and timing variations comprising:
a magnetic core array including a plurality of data storage cores and a timing core;
drive circuitry coupled to drive a selected data storage core and the timing core with substantially equal drive currents sufficient to cause switching from one state of magnetization to another during a read part of a memory cycle; and
a sensing circuit coupled to sense the magnitude of a selected data core output switching signal and the timing core output switching signal and to indicate as data output the condition of the data core output switching signal upon the occurrence of a peak in the timing core output switching signal, the data output of a selected core being indicated by comparing to zero the difference between a selected data core output switching signal and one-half the timing core output switching signal.

15. A core memory that is highly adaptive to changes in core drive current magnitude and core array temperature, input voltage and timing comprising:
a magnetic core array including a plurality of data storage cores and a timing core;
drive circuitry coupled to drive a selected data storage core and the timing core with substantially equal drive currents sufficient to cause switching from one state of magnetization to another during a read part of a memory cycle; and a sensing circuit coupled to sense the magnitude of a selected data core output switching signal and the timing core output switching signal and to indicate as data output the condition of the data core output switching signal upon the occurrence of a peak in the timing core output switching signal, the sensing circuit including a differential amplifier coupled to provide a first amplified signal indicative of the timing core output switching signal and a second amplified signal indicative of the timing core output switching signal, the second amplified signal having a greater gain, a voltage offset and a time delay relative to the first amplified signal such that the second amplified signal exceeds the first amplified signal in magnitude only from approximately the peak to the termination point of the timing core output signal and a comparator coupled to generate a sense amplifier strobe signal enabling the sensing circuit to sense the magnitude of the selected data core output switching signal when the magnitude of the second amplified signal exceeds the magnitude of the first amplified signal.

16. A core memory that is highly adaptive to changes in core drive current magnitude and core array temperature, input voltage and timing variations comprising a magnetic core array including a plurality of data storage cores and a timing core; drive circuitry coupled to drive a selected data storage core and the timing core with substantially equal drive currents sufficient to cause switching from one state of magnetization to another during a read part of a memory cycle; and a sensing circuit coupled to sense the magnitude of a selected data core output switching signal and the timing core output switching signal and to indicate as data output the condition of the data core output switching signal upon the occurrence of a peak in the timing core output switching signal, the sensing circuit including a differentiator coupled to receive the timing core switching signal and generate a differentiated switching signal as an output in response thereto, an integrator coupled to integrate the timing core output switching signal with a fixed offset and to generate an offset integrated switching signal as an output, and a comparator coupled to generate a sense amplifier strobe signal when the magnitude of the offset integrated switching signal exceeds the magnitude of the differentiated switching signal.

17. A core memory comprising:
a stack having a plurality of data store cores and a timing core therein, the timing core being coupled to be driven by the same drive current as a selected data storage core;
a peak detector coupled to detect a peak in an output switching signal voltage from the timing core during a read half cycle and generate a strobe signal in response thereto;
a threshold detector coupled to detect a magnitude drop of the timing core output switching signal voltage during a read half cycle and during a write half cycle and generate a magnetic feedback timing signal in response thereto;
a sensing circuit coupled to receive the difference between a selected core output switching signal and one-half the timing core output switching signal, the sensing circuit being coupled to latch and hold a data state upon the occurrence of the strobe signal with a first data state being latched if the difference is greater than zero and a second state being latched if the difference is less than zero;
and a control and timing circuit coupled to operate the memory in read and write half cycles with the drive current during each half cycle being terminated in response to the magnetic feedback timing signal.

18. A core memory comprising:
a core stack having an array of magnetic memory cores, drive conductors arranged to provide coincident current selection of a selected memory core, and a sense winding coupled to sense the switching of a magnetic memory core;
drive circuitry coupled to generate drive currents in the stack to produce coincident selection of a selected core within the stack in response to address signals;
a timing core coupled to receive the same driving current as the selected memory core;
a sensing circuit coupled to sense and indicate the state of core output switching signals appearing on the sense winding when enabled by a strobe signal; and
a strobe signal generating circuit coupled to generate the strobe signal and including a peak detector coupled to initiate the strobe signal upon the occurrence of a peak in a switching signal generated by the timing core during a read part cycle.

* * * * *